United States Patent
Awakura et al.

(10) Patent No.: US 6,712,989 B1
(45) Date of Patent: Mar. 30, 2004

(54) COMPOSITE MAGNETIC BODY AND ELECTROMAGNETIC INTERFERENCE SUPPRESSING BODY USING THE SAME

(75) Inventors: Yoshio Awakura, Yokohama (JP); Shigeyoshi Yoshida, Abiko (JP); Mikio Nishimura, Kawachi (JP)

(73) Assignee: Tokin Corporation, Sendai (JP)

( * ) Notice: Subject to any disclaimer, the term of this patent is extended or adjusted under 35 U.S.C. 154(b) by 0 days.

(21) Appl. No.: 09/857,998

(22) PCT Filed: Oct. 18, 2000

(86) PCT No.: PCT/JP00/07209
§ 371 (c)(1),
(2), (4) Date: Jun. 13, 2001

(87) PCT Pub. No.: WO01/29851
PCT Pub. Date: Apr. 26, 2001

(30) Foreign Application Priority Data

Oct. 18, 1999 (JP) ............................................. 11-295440

(51) Int. Cl.[7] .............................. H01F 1/12; H01F 1/26; C08L 83/00
(52) U.S. Cl. ............................. 252/62.51 R; 252/62.55; 524/424; 524/439; 524/440; 428/402; 428/446
(58) Field of Search ....................... 252/62.51 R, 62.55, 252/62.56; 524/439, 440, 424, 588, 441; 428/402, 446, 328, 405; 307/91

(56) References Cited

U.S. PATENT DOCUMENTS

| 4,731,191 A | 3/1988 | Swihart |
| 5,498,644 A | 3/1996 | Reo |
| 6,284,363 B1 * | 9/2001 | Maeda et al. ................ 428/328 |
| 6,514,428 B2 * | 2/2003 | Suzuki et al. ................. 252/74 |
| 2001/0051673 A1 * | 12/2001 | Suzuki et al. ................ 523/137 |
| 2002/0077439 A1 * | 6/2002 | Sakurai et al. ................ 528/10 |

FOREIGN PATENT DOCUMENTS

| DE | 2 137 487 | | 2/1973 |
| JP | 07207160 A | * | 8/1995 |
| JP | 10-92623 | | 4/1998 |
| JP | 2000101284 A | * | 4/2000 |
| JP | 2000174480 A | * | 6/2000 |
| JP | 2001044687 A | * | 2/2001 |

OTHER PUBLICATIONS

Abstract of JP 02–032599 A.*
Smithells Metal Reference Book, seventh edition, 1992, Butterworth–Heinemann Ltd., Linacre House, Jordan Hill, Oxford, pg 10–41, 10–53.*

* cited by examiner

*Primary Examiner*—Robert Dawson
*Assistant Examiner*—Marc Zimmer
(74) *Attorney, Agent, or Firm*—Frishauf, Holtz, Goodman & Chick, P.C.

(57) ABSTRACT

A composite magnetic body is obtained without the use of halogen-based or halogen-containing materials, such as, halogen-based binding agent of halogen-based resins or elastomers, and bromine-based fire retardents. The composite magnetic body (1) comprises a soft magnetic powder (2) and a silicone rubber (3). The silicone rubber (3) should preferably be a solid silicone rubber. An electromagnet interference suppressing body is obtained using this composite magnetic body.

14 Claims, 1 Drawing Sheet

COMPOSITE MAGNETIC BODY AND ELECTROMAGNETIC INTERFERENCE SUPPRESSING BODY USING THE SAME

This application is a U.S. National Phase Application under 35 USC 371 of International Application PCT/JP00/07209 (published in English) filed Oct. 18, 20001.

TECHNICAL FIELD

The present invention relates to a composite magnetic body used to suppress electromagnetic Interference brought about by interference from unwanted electromagnetic waves in a high-frequency band and to an electromagnetic interference suppressing body obtained by the use thereof, and more particularly to a such a composition of a fireproof type.

BACKGROUND ART

Cellular phones, personal computers, and other types of electronic equipment operated at high frequencies such as quasi-microwave band have become more widespread in recent years. In particular, smaller and lighter devices are urgently needed, with electromagnetic noise/interference posing a serious problem.

In view of this, composite magnetic bodies and electromagnetic interference suppressing bodies are being commercialized as a means of countering such high-frequency electromagnetic interference.

Conventional composite magnetic bodies and electromagnetic interference suppressing bodies, obtained by the use thereof are fireproofed by use of halogen-based fire retardants or by means of antimony trioxide as a fire retardant aid. Typically, such fireproofing techniques using halogen-based fire retardants and/or antimony trioxide fire-retardant aid are ordinary methods that are also applied to coating materials for electric wires or the like; casings for electronic equipment; and other products.

In some composite magnetic bodies, chlorinated polyethylene is used as a binding agent in order to improve the fire resistance characteristics or the filling properties of soft magnetic powders, and they also contain chlorine, which is a halogen.

There is a problem indications indicated that dioxins might be released under certain incineration conditions during the incineration disposal of chlorine-contained materials, although it has not yet completely understood.

Another problem, currently difficult to prove because of the absence of reliable reports, is a possible release of dioxins by fire retardants and other halogen-containing materials.

Concern is mounting regarding environmental issues and health safety, creating a need for the development of materials that are free of halogens and do not harm the environment.

In view of this, it is an object of the present invention to provide a composite magnetic body that is completely free of halogen-containing materials, for example, halogen-containing binding agents such as halogen-based resins or elastomers, and halogen-containing bromine-based fire retardants.

It is another object of the present invention to provide an electromagnetic interference suppressing body using this composite magnetic body.

DISCLOSURE OF THE INVENTION

In order to attain the stated objects, the present invention is directed to fireproof of a composite magnetic material without use of a halogen-based binding agent with good powder filling properties in the material and a halogen-based fire retardant having an adequate fire resistance effect.

According to an aspect of the present invention, there is obtained a composite magnetic body comprising a silicone rubber and a soft magnetic powder dispersed in the silicone rubber.

Preferably, in the aspect of the present invention, the silicone rubber may be a solid silicone rubber or a liquid silicone rubber of a chemically-setting type.

The silicone rubber may contain an additive containing at least one selected from a group consisting of platinum, silicon, titanium, iron, copper, nickel, and cobalt The silicone rubber may contain carbon black.

The soft magnetic powder may be a magnetic alloy powder having a flat shape.

The soft magnetic powder may have a specific surface area of 0.1–3 $m^2/g$, have an aspect ratio of 3 or more.

The soft magnetic powder may be surface-treated with a coupling agent having a SP value ranges from 6 to 10.

The coupling agent may be at least one compound selected from titanate, aluminate, and silane.

Also, the soft magnetic powder may be surface-treated with a primer having a SP value less than that of the soft magnetic powder but greater than that of the silicone rubber.

According to another aspect of the present invention, there is obtained an electromagnetic interference suppressing body characterized in that the aforementioned composite magnetic body is used to suppress electromagnetic interference brought about by interference from unwanted electromagnetic waves.

BEST MODE FOR EMBODYING THE INVENTION

Embodiments of the present invention will now be described with reference to drawings.

Figure 1:
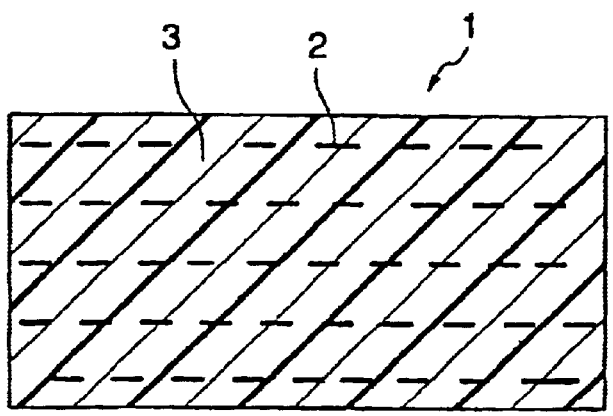
FIG. 1 is a cross-sectional view depicting the overall structure of a composite magnetic body according to an embodiment according of the present invention.

Referring to FIG. 1, the composite magnetic body 1 comprises a binding agent composed of silicone rubber, and a flat soft magnetic powder 2 whose planar surfaces lie along the same plane, horizontal plane in FIG. 1.

This composite magnetic, body functions as an electromagnetic interference suppressing body for suppressing electromagnetic interference brought about by interference from unwanted electromagnetic waves when this composite magnetic body is used for the internal or peripheral portions of electrical devices. Consequently, the composite magnetic body of the present embodiment will be treated as the below-described composition obtained by the method described below and will be referred to as an electromagnetic interference suppressing body when the composite magnetic body thus obtained is used for the internal or peripheral portions of electrical devices. Specifically, the composite magnetic body and electromagnetic interference suppressing body will be referred to differently because they are identical in terms of constituent components and manufacturing steps but different in terms of application. In the description that follows, this fact Is emphasized by employing different terms for the above-described reasons whenever a composite magnetic body or an electromagnetic interference suppressing body is mentioned.

As referred to herein, silicone rubber is one described in, for example, the section silicone in the Dictionary of Natural Sciences published by Iwanarni Shoten. That is, "Polymers whose main chain consists of repeating silicone bonds —$(Si—O)_n$—and whose side groups consist of alkyl, aryl, or other groups are collectively referred to as silicones. Not to be confused with silicon. Because of their molecular structure, silicones have excellent heat resistance, water repellency, electrical insulation, chemical resistance, aging resistance, and other properties. Depending on their degree of polymerization, type of side group, extent of cross-linking, and the like, silicones can be in the form of grease, rubber, or resin. A linear silicone with a low degree of polymerization that is fluid at normal temperature is called silicone oil; commonly it is a dimethyl dichlorosiliane polymer. A compound obtained by the moderate cross-linking of a highly polymerized linear plydimetylsiloxane or a copolymer thereof and provided with rubber-like elasticity is called silicone rubber. A compound obtained by the hydrolysis and polycondensation of a chlorosilane derivative $R_nSiCl_{(4-n)}$ and provided with a highly developed three-dimensional reticulated structure is called silicone resin or silicon resin.

An embodiment of the composite magnetic body and electromagnetic interference suppressing body according to the present invention will now be described.

EXAMPLE 1

The mixed formulation of the composite magnetic body according to Example 1 of the present invention is shown in Table 1 below. An Fe—Si—Al alloy powder (soft magnetic powder) was used as a filler. The same results were obtained when a composition based on Fe—Si—Al—Ni or the like was used as the soft magnetic powder. The composition used in Example 1 comprised 6–11 wt % Si and 4–7 wt % Al, with Fe constituting the balance. The powder had a mean grain size of 32 µm.

A kneaded magnetic material was first obtained by employing mixing rolls to knead 273 weight parts of the aforementioned soft magnetic powder, 100 weight parts of solid silicone rubber (binding agent), and 2 weight parts of a cross-linking agent. The same kneaded magnetic material could be obtained using a kneader, intensive mixer, or other kneading apparatus to perform the aforementioned kneading operation.

The resulting kneaded composite magnetic material was rolled between rolls arranged in parallel, yielding a composite magnetic body in the form of a sheet. An extruder could be used in addition to such rolls in order to obtain the sheeted composite. Press moldin,:g or another molding method capable of producing the desired shape could also be used.

The sheet was subsequently heat-pressed and subjected to a cross-linking reaction, yielding a sheeted composite magnetic body. The composite magnetic body manufactured by the above-described method functions as an electromagnetic interference suppressing body for suppressing electromagnetic interference brought about by interference from unwanted electromagnetic waves when this composite magnetic body is used for the internal or peripheral portions of electrical devices. A conventional example is also shown in Table 1 below in order to draw a comparison with Example 1 of the present invention. To facilitate comparison, the manufacturing method was performed under the same conditions as in Example 1.

The conventional example is markedly different from the present example In that a halogen-containing chlorinated polyethylene was used for the binding agent, and a halogen-containing brominated polymer was used for the fire retardant. In addition antimony trioxide was used as a fire retardant aid.

TABLE 1

| Mixing Composition | Example 1 (weight parts) | Example 2 (weight parts) | Example 3 (weight parts) | Conventional Example (weight parts) |
|---|---|---|---|---|
| (Binding Agent) | | | | |
| silicone rubber (solid) | 100 | | | |
| silicone rubber (2-component liquid) | | 100 | | |
| silicone rubber (1-component liquid) | | | 100 | |
| chlorinated polyethylene | | | | 100 |
| (Filler: Soft Magnetic Powder) | | | | |
| Fe-Al-Si alloy Mean Grain Size: 32 µm | 273 | 273 | 273 | 273 |
| (Fire Retardant) bromine-based polymer | 0 | 0 | 0 | 20 |
| (Fire Retardant Aid) antimony trioxide | 0 | 0 | 0 | 20 |
| (Cross-Linking Agent) peroxide | 2 | 0 | 0 | 2 |

EXAMPLE 2

A mixed formulation for the composite magnetic body according to Example 2 of the present Invention Is shown in Table 1 above together with Example 1.

The same Fe—Si—Al alloy powder as in Example 1 was used as a filler. As in Example 1, the same results were obtained when a composition based on Fe—Si—Al—Ni or the like was used as the soft magnetic powder.

A mixer was used to first mix an Fe—Si—Al alloy powder (soft magnetic powder) in an amount of 273 weight parts with a curing agent and a two-component liquid silicon rubber (main ingredient), used In a combined amount of 100 weight parts. The total amount of the three components was 373 weight parts. The composite magnetic material thus uniformly dispersed and mixed was molded into a composite magnetic body having a desired shape by using an injection molding machine. The material in the injection mold was made into a sheet and cured, yielding a composite magnetic sheet. Extrusion molding, press molding, or roll molding could also be used to manufacture the composite magnetic body in accordance with the present example 2.

EXAMPLE 3

A mixed formulation for the composite magnetic body according to Example 3 of the present invention is shown in Table 1 above together with Examples 1 and 2.

The same Fe—Si—Al alloy powder (soft magnetic powder) as in Example 1 was used as a filler. The same results were obtained when a composition based on Fe—Si—Al—Ni or the like was used as the soft magnetic powder.

In Example 3, 273 weight parts of the aforementioned soft magnetic powder and 100 weight parts of a single-component liquid silicone rubber were first mixed with the aid of a mixer. The total amount of the two components was 373 weight parts. The uniformly dispersed and mixed composite magnetic material was molded into a composite magnetic body by using an injection molding machine in the same manner as in Example 2. The material in the injection mold was made into a sheet and cured, yielding a composite magnetic sheet Extrusion molding, press molding, or roll molding could also be used to manufacture the composite magnetic body in accordance with the Example 3.

Results of burning tests involving composite magnetic sheets obtained in Examples 1–3 and a conventional example will now be described with reference to Table 2 below. Because composite magnetic bodies are often used for electronic components, the burning tests were performed as the below-described Vertical Burning Test UL 94V in accordance with the UL safety standards for the combustibility testing of plastic materials for equipment parts. The samples had a length of 12;7 mm, a width of 12.7 mm, and a thickness of 0.3 mm. The vertical burning tests were conducted using sample Nos. 1–5 (a total of five test pieces). The column titled "First Lingering Flame" shows the combustion time (in seconds) elapsed following a first flame contact, the column titled "Second lingering Flame" shows the combustion time elapsed following a second flame contact, and the column titled "Second Lingering Flame+ Smoldering Material" shows the combined smoldering time and combustion time elapsed following the second flame contact. "Smoldering time" refers to the time elapsed after flame burning has stopped, or the time during which a material burns without flame in the absence of flame burning.

TABLE 2

| | No. | Thickness (mm) | First Lingering Flame | Second Lingering Flame | Second Lingering Flame + Smoldering Material | Class |
|---|---|---|---|---|---|---|
| Example 1 | | | | | | |
| silicone rubber (solid) | 1 | 0.30 | 19 | 31 | 57 | Horizontal Burning Test HB |
| | 2 | 0.30 | 25 | 26 | 36 | |
| | 3 | 0.30 | 23 | 33 | 50 | |
| | 4 | 0.30 | 20 | 34 | 48 | |
| | 5 | 0.30 | 32 | 20 | 36 | |
| Example 2 | | | | | | |
| silicone rubber (2-component liquid) | 1 | 0.30 | 25 | 27 | 54 | Horizontal Burning Test HB |
| | 2 | 0.30 | 28 | 30 | 55 | |
| | 3 | 0.30 | 26 | 28 | 53 | |
| | 4 | 0.30 | 33 | 28 | 55 | |
| | 5 | 0.29 | 26 | 35 | 58 | |
| Example 3 | | | | | | |
| silicone rubber (1-component liquid) | 1 | 0.30 | 28 | 23 | 56 | Horizontal Burning Test HB |
| | 2 | 0.30 | 30 | 29 | 58 | |
| | 3 | 0.30 | 28 | 33 | 56 | |
| | 4 | 0.29 | 27 | 29 | 55 | |
| | 5 | 0.30 | 31 | 22 | 35 | |
| Conventional Example | | | | | | |
| chlorinated polyethylene halogen-based fire retardant | 1 | 0.30 | 2 | 1 | 5 | V-0 satisfied |
| | 2 | 0.30 | 4 | 2 | 6 | |
| | 3 | 0.30 | 3 | 2 | 6 | |
| | 4 | 0.30 | 4 | 1 | 4 | |
| | 5 | 0.30 | 3 | 1 | 5 | |

The conventional example satisfies Class V-0 requirements when subjected to vertical testing in accordance with Fire Resistance Standard UL 94V. However, chlorinated polyethylene was used as the binder and a halogen-based bromine was used as the fire retardant. The halogen content in the composite magnetic body was about 10%, assuming the overall weight of the composite magnetic body was 100.

By contrast, the above-described Example 1 is halogen-free, making it possible to achieve so-called un-halogenation. However, the example fails to meet Classes V-0 and V-1 of the same standard in Vertical Burning Test UL 94V. It is still possible to satisfy the requirements of Horizontal Burning Test UL 94HB, which is less stringent than Vertical Burning Test UL 94V.

Although composite magnetic bodies using the chemically setting liquid silicone rubber in Examples 2 and 3 fail to satisfy the requirements corresponding to Classes V0 and V-1, of Vertical Burning Test UL 94V, they satisfy the requirements of Horizontal Burning Test UL 94HB, which is less by stringent that the aforementioned standard in terms of fire resistance. It is thus possible to fill silicone rubber, which is a halogen-free binding agent, with a soft magnetic powder and to fabricate a composite magnetic body. It has also been confirmed that the resulting fire resistance corresponds to Class UL94HB.

An attempt was made to improve fire resistance even further by employing a method in which silicone rubber (binding agent) was rendered fire resistant. Table 3 shows combustion times obtained when various fire retardants were added per 100 weight parts of silicone rubber in a fire-resistant mixture. According to the results obtained, combustion time is reduced from by 24–45 seconds in comparison with the use of silicone rubber alone. This is because adding a fire retardant has the effect of slowing down the decomposition of siloxane bonds (main chains of silicone rubber) during combustion, thereby suppressing the combustion process.

TABLE 3

| | Additive | Amount | Combustion Time (seconds) |
|---|---|---|---|
| Mixture 1 | platinum | 55 ppm | 43 |
| | silicon dioxide | 60 | |
| 2 | platinum | 55 ppm | 22 |
| | silicon dioxide | 60 | |
| | carbon black | 2 | |
| 3 | platinum | 55 ppm | 32 |
| | silicon dioxide | 60 | |
| | ferrous oxide | 5 | |
| 4 | platinum | 55 ppm | 33 |
| | silicon dioxide | 60 | |
| | ferric oxide | 5 | |

TABLE 3-continued

|   | Additive | Amount | Combustion Time (seconds) |
|---|---|---|---|
| 5 | platinum | 55 ppm | 30 |
|   | silicon dioxide | 60 |  |
|   | titanium oxide | 5 |  |
| 6 | platinum | 55 ppm | 41 |
|   | silicon dioxide | 60 |  |
|   | copper dioxide | 5 |  |
| 7 | platinum | 55 ppm | 40 |
|   | silicon dioxide | 60 |  |
|   | nickel | 5 |  |
| 8 | platinum | 55 ppm | 40 |
|   | silicon dioxide | 60 |  |
|   | nickel | 5 |  |
| silicone rubber alone |  | 0 | 67 |

Further studies are to be performed concerning the fireproofing of composite magnetic bodies by making use of platinum, silicon dioxide, and carbon black as such additives.

EXAMPLE 4

The mixing composition of a composite magnetic body according to a fourth embodiment of the present invention is shown In Table 4 below as Example 4. With the exception of the fire retardant, the same mixture was used for the above-described silicone rubber in order to be able to draw a comparison with Example 1.

TABLE 4

| Mixing Composition | Example 4 (weight parts) |
|---|---|
| (Binding Agent) | 100 |
| silicone rubber (solid) |  |
| (Fire Retardant) |  |
| platinum | 55 ppm |
| silicon dioxide | 60 |
| carbon black | 2 |
| (Filler: Soft Magnetic Powder) |  |
| Fe-Al-Si alloy | 273 |
| Mean Grain Size: 32 μm |  |
| (Cross-Linking Agent) | 2 |
| peroxide |  |

Mixing rolls were first used to knead and disperse 100 weight parts of solid silicone rubber (binding agent), 2 weight parts of a cross-linking agent, 55 weight parts (ppm) platinum (fire retardant), 60 weight parts silicon dioxide, and 2 weight parts carbon black. The resultant mixture was further mixed and kneaded with 273 weight parts of an Fe—Si—Al alloy powder (soft magnetic powder) by the aid of mixing rolls. The similar kneaded magnetic material could also be obtained by using a kneader, Intensive mixer, or other kneading apparatus to perform the kneading operation.

The resulting kneaded composite magnetic material was rolled between rolls arranged in parallel, thereby yielding a composite magnetic body in the form of a sheet. An extruder could be used in addition to such rolls In order to obtain the sheeted composite. Press molding or extrusion molding shape could also be used.

The sheet was subsequently heat-pressed and subjected to a cross-linking reaction, thereby yielding a sheeted composite magnetic body.

The composite magnetic body manufactured by the above-described method functions as an electromagnetic interference suppressing body for suppressing electromagnetic interference brought about by interference from unwanted electromagnetic waves when this composite magnetic body is used for the internal or peripheral portions of electrical devices.

Results of burning tests involving the composite magnetic sheet of Example 4 are shown in Table 5 below. Fire resistance is improved in comparison with Examples 1–3, and the results correspond to Class V-1 of Vertical Burning Test UL 94V.

TABLE 5

| Example 4 | No. | Thickness (mm) | First Lingering Flame | Second Lingering Flame | Second Lingering Flame + Smoldering Material | Class |
|---|---|---|---|---|---|---|
| silicone | 1 | 0.30 | 18 | 13 | 23 | V-1 |
| rubber | 2 | 0.30 | 21 | 11 | 22 |  |
| (solid) | 3 | 0.30 | 16 | 15 | 25 |  |
| with Fire | 4 | 0.30 | 19 | 18 | 33 |  |
| Retardant | 5 | 0.29 | 12 | 16 | 22 |  |
| added |  |  |  |  |  |  |

Comparisons were made concerning the combined lingering flame time (seconds) following a first flame contact and lingering flame time following a second flame contact (that is, the lingering flame time (in seconds) following all ten flame contacts) for each of the five test piece Nos. 1–5, and it was found that whereas this time was 263 seconds in Example 1, it was only 159 seconds, or 106 seconds less, In Example 4.

EXAMPLE 5

Similar to Example 4, the same mixtures and methods were used for all ingredients except the soft magnetic powder. The Fe—Si—Al alloy powder used in Example 4 was treated for another 5 hours with an attritor, yielding flat-shaped particles, and the resulting Fe—Si—Al alloy powder with a mean grain size of 37 pan was used as the soft magnetic powder (filler).

Mixing rolls were first used to knead and disperse 100 weight parts of solid silicone rubber (binding agent), 2 weight parts of a cross-linking agent (vulcanizing agent or curing agent), 55 weight parts (ppm) platinum, 60 weight parts silicon dioxide, and 2 weight parts carbon black (fire retardants). The resultant mixture was further mixed and kneaded with 273 weight parts of the aforementioned flat Fe—Si—Al alloy powder by the aid of mixing rolls. The resulting kneaded composite magnetic body was rolled between rolls arranged in parallel, thereby yielding a composite magnetic body in the form of a sheet.

The sheet was subsequently, heat-pressed and subjected to a cross-linking reaction, thereby yielding a sheeted composite magnetic body.

The composite magnetic body was tested for fire resistance and was found to correspond to Class V-1 of Vertical Burning Test UL 94V, as shown in Table 7 below.

Then, attempting to grade up fireproof above Class V-1, various experiments were performed, but it was impossible to achieve Fire Resistance Standard V-0 with combination of silicone rubber and a soft magnetic powder, especially, a soft magnetic alloy powder. This is because the flammability of the composite magnetic material is promoted due to high thermal conductivity and/or the catalytic action of the soft magnetic alloy powder, thus making a extremely difficult to achieve self-extinguishing, which is the main element of fire resistance. In addition, the soft magnetic metal powder itself Is often an active flammable solid, thereby making it more difficult to achieve self-extinguishing.

In view of this, an attempt was made to manage fire resistance by varying the grain size of the soft magnetic powder in order to achieve the desired level of fire resistance. However, grain size merely determines the particulate size of the powder and does not reflect the surface state of the powder, that is, the area of the surface in contact with air and other media. In addition, fire resistance varies with the grain size distribution of a powder.

TABLE 6

| Mixing Composition | Example 6 (weight parts) | Example 7 (weight parts) |
| --- | --- | --- |
| (Binding Agent) | | |
| silicone rubber (solid) | 100 | 100 |
| platinum | 55 ppm | 55 ppm |
| silicon dioxide | 60 | 60 |
| carbon black | 2 | 2 |
| (Filler: Soft Magnetic Powder) | | |
| Treatment by Attritor for 17 hours flat shape Fe-Al-Si alloy Mean Grain Size: 32 μm Specific Surface Area: 1.6 m²/g | 273 | |
| Treatment by Attritor for 17 hours flat shape Fe-Al-Si alloy Mean Grain Size: 32 μm Specific Surface Area: 1.5 m²/g Aspect Ratio: 28 | | 273 |
| Cross-Linking Agent | 2 | 2 |

TABLE 7

| | No. | Thickness (mm) | First Lingering Flame | Second Lingering Flame | Second Lingering Flame + Smoldering Material | Class |
| --- | --- | --- | --- | --- | --- | --- |
| Example 5 | | | | | | |
| Treatment by flat-shaped soft magnetic attritor for 5 hours | 1 | 0.30 | 19 | 11 | 23 | V-1 |
| | 2 | 0.31 | 22 | 13 | 20 | |
| | 3 | 0.30 | 20 | 16 | 24 | |
| | 4 | 0.29 | 18 | 18 | 28 | |
| | 5 | 0.30 | 23 | 20 | 30 | |
| Example 6 | | | | | | |
| Soft Magnetic Powder having Specific Surface Area of 1.5 m²/g | 1 | 0.29 | 4 | 1 | 5 | V-0 |
| | 2 | 0.30 | 3 | 2 | 6 | Satisfied |
| | 3 | 0.30 | 2 | 1 | 5 | |
| | 4 | 0.30 | 4 | 1 | 4 | |
| | 5 | 0.30 | 4 | 1 | 4 | |
| Example 7 | | | | | | |
| Soft Magnetic | 1 | 0.29 | 6 | 1 | 5 | V-0 |
| | 2 | 0.30 | 5 | 2 | 6 | Sat- |

TABLE 7-continued

| | No. | Thickness (mm) | First Lingering Flame | Second Lingering Flame | Second Lingering Flame + Smoldering Material | Class |
| --- | --- | --- | --- | --- | --- | --- |
| Powder having Aspect Ratio of 28 | 3 | 0.30 | 3 | 1 | 4 | isfied |
| | 4 | 0.30 | 4 | 3 | 7 | |
| | 5 | 0.30 | 7 | 2 | 4 | |

EXAMPLE 6

For the samples of Example 6, as shown in Table 6, the specific surface area of powder was used as a physical value that could be used to accurately define powder properties, and composite magnetic bodies were fabricated by limiting the surface area of soft magnetic powders to 0.1–3 m²/g.

Figure 2:
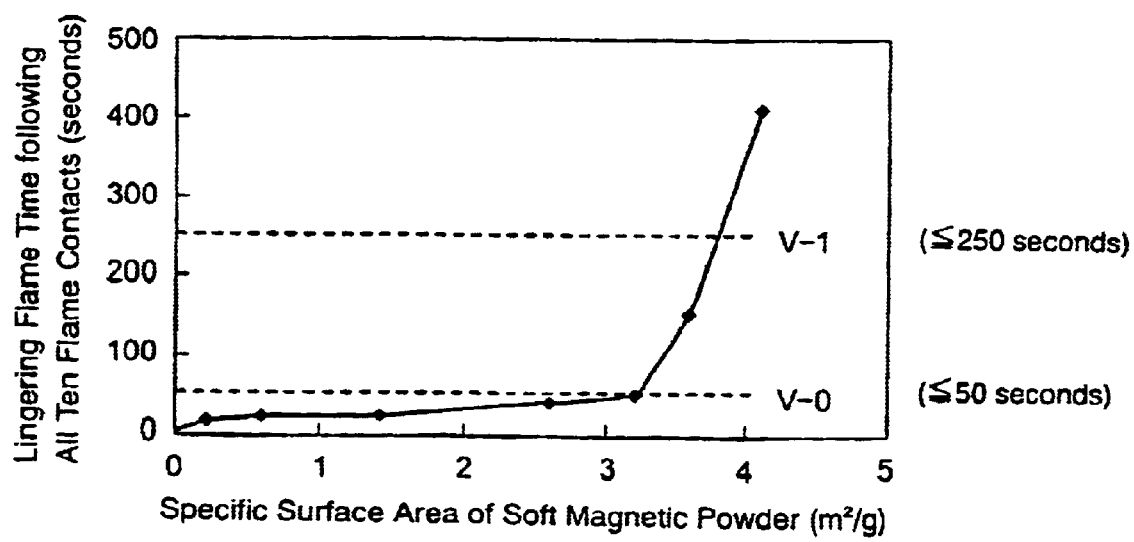
FIG. 2 is a diagram depicting the results of Vertical Burning Test UL 94V as a function of the specific surface area of the soft magnetic powder used in the composite magnetic body according to the embodiment of the present invention.

Also shown here are the results of Vertical Burning Test UL 94V involving composite magnetic bodies obtained using soft magnetic powders with varying specific surface areas, as shown in Table 7. The composite magnetic body was manufactured by the similar method as in Example 1. FIG. 2 also shows results of Vertical Burning Test UL 94V according to the specific surface areas of soft magnetic powders. When the specific surface area is 0.1 m²/g or less, the lingering flame time following all ten flame contacts is about 10 seconds. The time is 17 seconds 20 seconds, or 37 seconds when the specific surface area is 0.6 m²/g. 1.4 M²/g or 2.6 m²/g, respectively. The time is 48 seconds when the specific surface area exceeds 3 m²/g (when it Is 3.2 m²/g), and reaches 415 seconds when the specific surface area is 4.1 m²/g.

The results concerning the specific surface area of the soft magnetic powders and the fire resistance characteristics of the composite magnetic bodies indicate that the specific surface area thereof should be 3 m²/g or less in order to satisfy Class V-0 requirements of burning tests, taking into account the level of productivity acceptable in commercial terms. A product with a specific surface area of 0.1 m²/g or less corresponds to Class V-0 and exhibits self-extinguishing properties when subjected to a burning test A narrower specific surface area has an adverse effect on magnetic characteristics and makes it impossible to obtain adequate electromagnetic interference suppression effects.

The same applies to a case in which the material used has the same Fe—Si—Al alloy composition as in Example 1 (Embodiment 1) and possesses a specific surface area of less than 0.1 m²/g. This material has the necessary self-extinguishing properties, but it magnetic characteristics deteriorate due to the reduced powder flatness, and the product cannot suppress electromagnetic interference as a composite magnetic body.

In this example, the filler was a soft magnetic powder with a specific surface area of 1.6 m²/g. The soft magnetic powder was an Fe—Si—Al alloy powder with the same composition as in Example 1 and a mean grain size of 32 μm. To make it easier to compare methods for manufacturing composite magnetic bodies, the same manufacturing method as in Example 4 was used to obtain the composite magnetic body in this example.

EXAMPLE 7

In Example 7, as shown in Table 6, the soft magnetic powder had the necessary flatness of a filler and possessed an aspect ratio of 28. The soft magnetic powder was an Fe—Si—Al alloy powder with the same composition as in Example 1 and a mean grain size of 32 μm. To make it easier to compare methods for manufacturing composite magnetic bodies, the same manufacturing method as in Example 4 was used to obtain the composite magnetic body in this example.

As can be seen in Table 7 above, Vertical Burning Test UL 94V involving Examples 7 and 8 satisfies V-0 requirements.

A study involving tight filling of soft magnetic powder into silicone rubber was also conducted. Although certain fire resistance was achieved, the filling ratio of the powders was low, resulting in unacceptable deterioration for magnetic characteristics. In view, of this, magnetic characteristics were improved when the kneading time of mixing rolls was extended or the rotational speed ratio of the two rolls was set to 1.7 or higher in order to enhance shear and to increase the filling ratio of silicone powders, but these measures had a profoundly adverse effect on the moldability of composite magnetic materials and resulted in a significantly lower mechanical strength.

In view of this, a composite magnetic body was molded after surface treatment with a coupling agent (soft magnetic powder). As a result, the magnetic permeability was raised from 12 to 17. This was because the affinity between the soft magnetic powder and the binding agent was improved by the use of a coupling agent. In particular, the coupling agent is specified to ones having a SP (Solubility Parameter) value of 6 to 10 and thereby the magnetic powder is Improved in solubility into silicone matrix rubber, so that a highly moldable composite magnetic body was obtained. For coupling agents, titanates, aluminates, silanes, and phosphates are primarily used, and the first three types of coupling halogens improve the filling properties of soft magnetic powders because hydrophilic groups containing titanium, aluminum, and the like interact with soft magnetic powders and chemically bond with the surfaces of the soft magnetic powders.

EXAMPLE 8

Table 8 shows the mixed formulation of the composite magnetic body according to Example 8 of the present invention is shown. To manufacture the composite magnetic body, 273 weight parts of the aforementioned soft magnetic powder was firstly subjected to a preliminary surface treatment wherein the powder was agitated together with 3 weight parts of a titanate-based coupling agent with an SP value of 8.6 were first by using a mixer or the like. During the surface treatment of a soft magnetic powder with a coupling agent, the surface treatment agent could be diluted with a diluent or the like to achieve uniform surface treatment. To make it easier to compare methods for the subsequent manufacture of magnetic bodies, the same manufacturing method as in Example 4 was used to obtain the composite magnetic body in this example.

As can be seen In Table 8 below, Vertical Burning Test UL 94V satisfies the Class V-0 requirements.

TABLE 8

| Mixing Composition | Example 8 (weight parts) | Example 9 (weight parts) |
| --- | --- | --- |
| (Binding Agent) | | |
| silicone rubber (solid) | 100 | 100 |
| platinum | 55 ppm | 55 ppm |

TABLE 8-continued

| Mixing Composition | Example 8 (weight parts) | Example 9 (weight parts) |
| --- | --- | --- |
| silicon dioxide | 60 | 60 |
| carbon black | 2 | 2 |
| (Filler: Soft Magnetic Powder) | | |
| Treatment by Attritor for 17 hours flat shape Fe-Al-Si alloy Mean Grain Size: 32 μm Specific Surface Area: 1.5 m²/g Aspect Ratio: 28 | 273 | 273 |
| (Coupling Agent) SP value: 8.6 | 3 | |
| (Primer) SP value: Soft Magnetic Powder > Primer > silicone rubber | 0 | 3 |
| Cross-Linking Agent | 2 | 2 |

TABLE 9

| | No. | Thickness (mm) | First Lingering Flame | Second Lingering Flame | Second Lingering Flame + Smoldering Material | Class |
| --- | --- | --- | --- | --- | --- | --- |
| Example 8 | | | | | | |
| SP value: 8.6 Coupling Agent | 1 | 0.29 | 2 | 1 | 5 | V-0 |
| | 2 | 0.30 | 4 | 2 | 4 | Satisfied |
| | 3 | 0.30 | 4 | 1 | 5 | |
| | 4 | 0.30 | 3 | 1 | 6 | |
| | 5 | 0.30 | 3 | 1 | 4 | |
| Example 9 | | | | | | |
| Treatment by Primer | 1 | 0.29 | 2 | 1 | 5 | V-0 |
| | 2 | 0.30 | 5 | 2 | 7 | Satisfied |
| | 3 | 0.30 | 3 | 1 | 6 | |
| | 4 | 0.30 | 6 | 1 | 4 | |
| | 5 | 0.30 | 2 | 1 | 6 | |

EXAMPLE 9

The mixed formulation of the composite magnetic body according to Example 9 of the present invention is shown in Table 8 above. First, 273 weight parts of the aforementioned soft magnetic powder was subjected to a preliminary surface treatment wherein the powder was agitated together with 3 weight parts of primer which is recommended by a silicone rubber manufacturer and provided with an SP value intermediate between those of the soft magnetic power and a binding agent, using a mixer or the like. During the surface treatment of the soft magnetic powder with the primer, the surface treatment agent may be diluted w a diluent or the like to achieve uniform surface treatment.

To make it easier to compare methods for the subsequent manufacture of composite magnetic bodies, the same manufacturing methods as in Example 4 were used to perform the processes downstream of the surface treatment step.

As can be seen in Table 8 above, the fire resistance of the composite magnetic bodies obtained in the present inventive example meet the Class V0 requirements of Vertical Burning Test UL 94V.

As described above, the present invention allows a halogen-free, environmentally safe composite magnetic body and electromagnetic interference suppressing body to be obtained through the use of silicone rubber as a binding agent for the composite magnetic body. In addition, the composite magnetic sheet of the present invention, which was obtained by defining the physical properties of a soft magnetic powder in terms of specific surface area, had self-extinguishing properties (the main element of fire resistance) and satisfied Class V-0 requirements of Burning Test UL 94.

INDUSTRIAL APPLICABILITY

The composite magnetic body of the present invention possess fire resistance and is therefore suitable as an electromagnetic interference suppressing body for suppressing high-frequency electromagnetic interference in cellular phones, personal computers, and other types of electronic equipment operated at high frequencies.

What is claimed is:

1. A composite magnetic body comprising a silicone rubber and a soft magnetic powder dispersed in the silicone rubber, the soft magnetic powder having a specific surface area of 0.1–3 $m^2/g$, wherein the soft magnetic powder is a magnetic alloy powder having a flat shape.

2. A composite magnetic body as recited in claim 1, wherein the silicone rubber is at least one type of material selected from the group consisting of solid silicone rubber and chemically setting liquid silicone rubber.

3. A composite magnetic body as recited in claim 1, wherein the silicone rubber contains an additive comprising at least one element selected from the group consisting of platinum, silicon, titanium, iron, copper, nickel and cobalt.

4. A composite magnetic body as recited in claim 1, wherein the silicone rubber contains an additive comprising carbon black.

5. A composite magnetic body as recited in claim 1, wherein the soft magnetic powder has an aspect ratio of 3 or more.

6. A composite magnetic body as recited in claim 1, wherein the soft magnetic powder is surface-treated with a coupling agent having a solubility parameter value ranging from 6 to 10.

7. A composite magnetic body as recited in claim 6, wherein the coupling agent is at least one compound selected from the group consisting of titanate, aluminate and silane.

8. An electromagnetic interference suppressing body for suppressing electromagnetic interference brought about by the interference of unwanted electromagnetic waves, wherein said electromagnetic interference suppressing body is made of a composite magnetic body comprising a silicone rubber and a soft magnetic powder dispersed in the silicone rubber, the soft magnetic powder having a specific surface area of 0.1–3 $m^2/g$, wherein the soft magnetic powder is a magnetic alloy powder having a flat shape.

9. An electromagnetic interference suppressing body as recited in claim 8, wherein the silicone rubber is at least one type of material selected from the group consisting of solid silicone, rubber and chemically setting liquid silicone rubber.

10. An electromagnetic interference suppressing body as recited in claim 8, wherein the silicone rubber contains an additive comprising at least one element selected from the group consisting of platinum, silicon, titanium, iron, copper, nickel and cobalt.

11. An electromagnetic interference suppressing body as recited in claim 8, wherein the silicone rubber contains an additive comprising carbon black.

12. An electromagnetic interference suppressing body as recited in claim 8, wherein the soft magnetic powder has an aspect ratio of 3 or more.

13. An electromagnetic interference suppressing body as recited in claim 8, wherein the soft magnetic powder is surface-treated with a coupling agent having a solubility parameter value ranging from 6 to 10.

14. An electromagnetic interference suppressing body as recited in claim 13, wherein the coupling agent is at least one compound selected from the group consisting of titanate, aluminate and silane.

* * * * *